(12) United States Patent
Lee

(10) Patent No.: US 10,937,751 B2
(45) Date of Patent: Mar. 2, 2021

(54) BUMP STRUCTURE MANUFACTURING METHOD

(71) Applicant: LBSEMICON CO., LTD., Gyeonggi-do (KR)

(72) Inventor: Jin Kuk Lee, Gyeonggi-do (KR)

(73) Assignee: LBSEMICON CO., LTD., Gyeonggi-Do (KR)

( * ) Notice: Subject to any disclaimer, the term of this patent is extended or adjusted under 35 U.S.C. 154(b) by 203 days.

(21) Appl. No.: 16/310,976

(22) PCT Filed: Dec. 28, 2017

(86) PCT No.: PCT/KR2017/015668
§ 371 (c)(1),
(2) Date: Dec. 18, 2018

(87) PCT Pub. No.: WO2018/164359
PCT Pub. Date: Sep. 13, 2018

(65) Prior Publication Data
US 2020/0266163 A1    Aug. 20, 2020

(30) Foreign Application Priority Data
Mar. 6, 2017    (KR) .................. 10-2017-0028343

(51) Int. Cl.
*H01L 23/00*    (2006.01)
*H01L 21/304*    (2006.01)
(Continued)

(52) U.S. Cl.
CPC ............ *H01L 24/11* (2013.01); *H01L 21/304* (2013.01); *H01L 21/6836* (2013.01);
(Continued)

(58) Field of Classification Search
CPC ......... H01L 24/11; H01L 24/05; H01L 24/13; H01L 2224/0401; H01L 24/12
See application file for complete search history.

(56) References Cited

U.S. PATENT DOCUMENTS

2005/0218479 A1*  10/2005  Park ...................... H01L 24/32
257/620

FOREIGN PATENT DOCUMENTS

JP    2012142401 A    7/2012
JP    2016146395 A    8/2016
(Continued)

*Primary Examiner* — Stephen M Bradley
*Assistant Examiner* — Wasiul Haider
(74) *Attorney, Agent, or Firm* — Stuart H. Mayer; Mayer & Williams PC

(57) ABSTRACT

Provided is a method of manufacturing a bump structure, the method including a first step for preparing a wafer including a plurality of chips each including a die pad, an under bump metal (UBM) layer on the die pad, and a bump pattern on the UBM layer, a second step for attaching a backgrinding film to an upper surface of the wafer, a third step for grinding a rear surface of the wafer by a certain thickness, a fourth step for forming a flexible material layer on a second rear surface of the wafer after being ground, and then attaching dicing tape including a ring frame, to the flexible material layer, a fifth step for removing the backgrinding film and then performing a curing process to harden the flexible material layer, and a sixth step for performing a dicing process to cut the plurality of chips into individual chips.

3 Claims, 6 Drawing Sheets

(51) Int. Cl.
*H01L 21/683* (2006.01)
*H01L 21/78* (2006.01)
(52) U.S. Cl.
CPC .............. *H01L 21/78* (2013.01); *H01L 24/05* (2013.01); *H01L 24/13* (2013.01); *H01L 2221/6834* (2013.01); *H01L 2221/68327* (2013.01); *H01L 2224/0401* (2013.01); *H01L 2224/05083* (2013.01); *H01L 2224/05124* (2013.01); *H01L 2224/05147* (2013.01); *H01L 2224/05166* (2013.01); *H01L 2224/05184* (2013.01); *H01L 2224/11009* (2013.01); *H01L 2224/11462* (2013.01); *H01L 2224/11464* (2013.01); *H01L 2224/1357* (2013.01); *H01L 2224/13563* (2013.01); *H01L 2224/13583* (2013.01); *H01L 2224/13644* (2013.01); *H01L 2224/13647* (2013.01); *H01L 2224/13655* (2013.01); *H01L 2924/3511* (2013.01)

(56) References Cited

FOREIGN PATENT DOCUMENTS

| KR | 1020140039330 | 4/2014 |
| KR | 1020140097591 | 8/2014 |
| KR | 1020160143486 | 12/2016 |

\* cited by examiner

BUMP STRUCTURE MANUFACTURING METHOD

TECHNICAL FIELD

The present invention relates to a method of manufacturing a bump structure and, more particularly, to a method of manufacturing a bump structure by using a wafer including a plurality of chips.

BACKGROUND ART

As electronic apparatuses are improved in various functions and are reduced in sizes, development of a bump for bonding an electronic device and a method of manufacturing the same is in progress. Current electronic apparatuses are becoming thinner and smaller to meet demands for portability, and are required to have higher capacitance and higher-speed calculation. For this reason, the number of layers stacked to produce chips is increasing and the thickness of a semiconductor wafer used for the chips is decreasing. The wafer is required to be thinned from a thickness of about 350 µm of a general wafer, to a thickness equal to or less than 50 µm to 200 µm. Thinning of the wafer involves warpage of the wafer such that a large number of problems occur in subsequent processes. In addition, since warpage of the wafer also occurs in a curing process performed after the thinning process, a solution thereto is required.

DETAILED DESCRIPTION OF THE INVENTION

Technical Problem

The present invention provides a method of manufacturing a bump structure, the method being capable of preventing warpage due to a wafer thinning process and a curing process. However, the scope of the present invention is not limited thereto.

Technical Solution

According to an aspect of the present invention, there is provided a method of manufacturing a bump structure, the method including a first step for preparing a wafer including a plurality of chips each including a die pad, an under bump metal (UBM) layer on the die pad, and a bump pattern on the UBM layer, a second step for attaching a backgrinding film to an upper surface of the wafer, a third step for grinding a rear surface of the wafer by a certain thickness, a fourth step for forming a flexible material layer on a second rear surface of the wafer after being ground, and then attaching dicing tape including a ring frame, to the flexible material layer, a fifth step for removing the backgrinding film and then performing a curing process to harden the flexible material layer, and a sixth step for performing a dicing process to cut the plurality of chips into individual chips.

The curing process to harden the flexible material layer may be performed after the dicing tape is attached.

The dicing tape may be attached before the backgrinding film is removed.

The flexible material layer may include a film containing a liquid component.

According to another aspect of the present invention, there is provided a method of manufacturing a bump structure, the method including a first step for preparing a wafer including a plurality of chips each including a die pad, an under bump metal (UBM) layer on the die pad, and a bump pattern on the UBM layer, a second step for attaching a backgrinding film to an upper surface of the wafer, a third step for grinding a rear surface of the wafer by a certain thickness, a fourth step for attaching an integrated film of a flexible material layer and dicing tape to a second rear surface of the wafer after being ground, a fifth step for removing the backgrinding film and then performing a curing process to harden the flexible material layer, and a sixth step for performing a dicing process to cut the plurality of chips into individual chips.

The curing process to harden the flexible material layer may be performed after the dicing tape is attached.

The dicing tape may be attached before the backgrinding film is removed.

The flexible material layer may include a film containing a liquid component.

According to another aspect of the present invention, there is provided a method of manufacturing a bump structure, the method including a first step for preparing a wafer including a plurality of chips each including a die pad, an under bump metal (UBM) layer on the die pad, and a bump pattern on the UBM layer, a second step for attaching a backgrinding film to an upper surface of the wafer, a third step for grinding a rear surface of the wafer by a certain thickness, a fourth step for removing the backgrinding film, a fifth step for attaching the bump pattern to dicing tape including a ring frame, a sixth step for forming a flexible material layer on a second rear surface of the wafer after being ground, a seventh step for performing a curing process to harden the flexible material layer, an eighth step for performing a dicing process to cut the plurality of chips into individual chips.

The curing process to harden the flexible material layer may be performed after the dicing tape is attached.

The flexible material layer may include a film containing a liquid component.

Advantageous Effects

As described above, according to an embodiment of the present invention, a method of manufacturing a bump structure, the method being capable of preventing warpage due to wafer thinning may be implemented. However, the scope of the present invention is not limited to the above-described effect.

MODE OF THE INVENTION

Figure 1A:
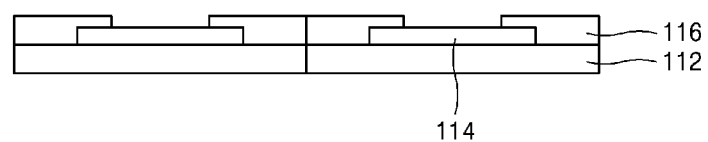
FIGS. 1A to 1G are cross-sectional views for sequentially describing common first-half steps of methods of manufacturing a bump structure, according to embodiments of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

FIGS. 1A to 1G are cross-sectional views for sequentially describing common first-half steps of methods of manufacturing a bump structure, according to embodiments of the present invention.

Referring to FIGS. 1A to 1F, a wafer 112 including a plurality of chips each including a die pad 114, an under bump metal (UBM) layer 120a on the die pad 114, and a bump pattern 140 on the UBM layer 120a is prepared. Only two chips are illustrated in the drawings for clarity.

Initially, referring to FIG. 1A, the die pad 114 is formed in each chip. The die pad 114 may be formed by generating and patterning a metal layer. As a non-limiting example, the metal layer may include an aluminum (Al) layer or a tungsten (W) layer. The die pad 114 may be electrically connected to a rewiring pattern formed to efficiently establish an electrical connection. Each chip may further include a passivation pattern 116 for preventing physical or chemical damages of the rewiring pattern and the die pad 114 due to an external factor.

Figure 1B:
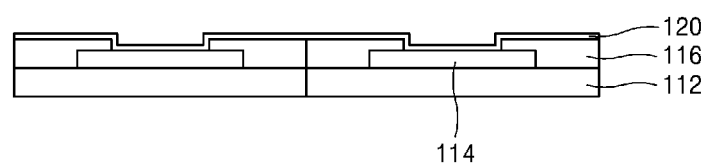

Referring to FIG. 1B, an UBM layer 120 is formed to cover the passivation pattern 116 and the die pads 114. The UBM layer 120 may be configured as a diffusion barrier layer and a seed layer. As a non-limiting example, the diffusion barrier layer may include titanium tungsten (TiW) or titanium (Ti), and the seed layer may include copper (Cu). In this case, Cu is used to serve as a seed layer for electroplating, and TiW or Ti is used to serve as a diffusion barrier layer for preventing diffusion between the Cu seed layer and a final metal pad made of an aluminum alloy, in a heat treatment or packaging process.

Figure 1C:
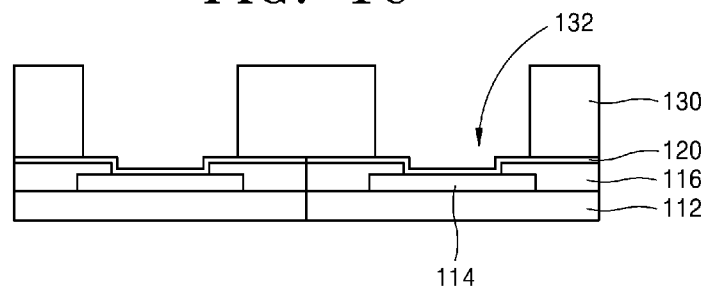

Referring to FIG. 1C, a photoresist pattern 130 is formed to expose regions corresponding to the die pads 114. The regions corresponding to the die pads 114 correspond to openings 132 of the photoresist pattern 130.

Figure 1D:
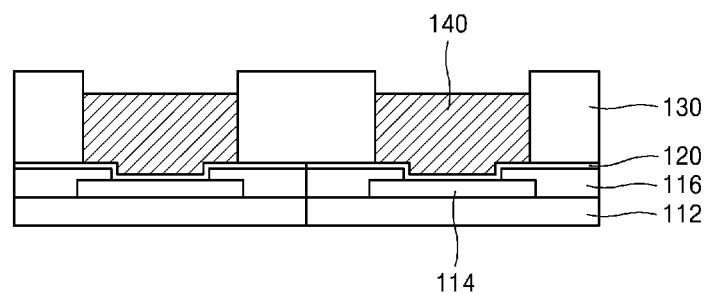

Referring to FIG. 1D, the bump pattern 140 is formed to fill the openings 132 of the photoresist pattern 130. The bump pattern 140 may be formed by plating a metal layer. As a non-limiting example, the metal layer may include a single gold (Au) layer or a multilayer metal layer. A multilayer bump may be, for example, a multilayer. Cu/Ni/Au (CNA) bump.

Compared to an Au bump, a multilayer CNA bump may be regarded as a next-generation bump structure capable of replacing the Au bump in a display driver IC package due to low manufacturing costs and excellent heat radiation characteristics thereof, and may be applied to a semiconductor device package using a CNA bump due to low resistance characteristics of Cu. The CNA bump may be manufactured using an electroplating method and an electroless plating method together or using only the electroplating method. When the electroplating method and the electroless plating method are used together, Cu may be plated using the electroplating method and Ni and Au may be plated using the electroless plating method, or Cu and Ni may be plated using the electroplating method and only Au, i.e., camping metal, may be plated using the electroless plating method.

Figure 1E:
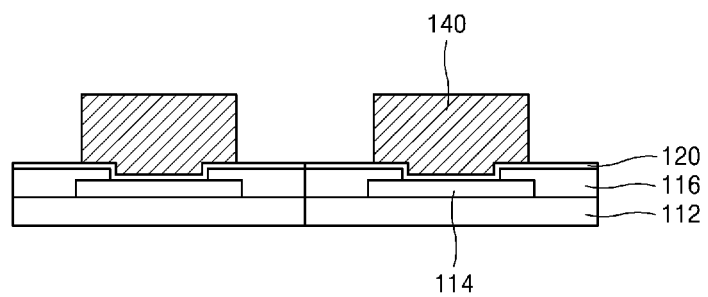
Figure 1F:
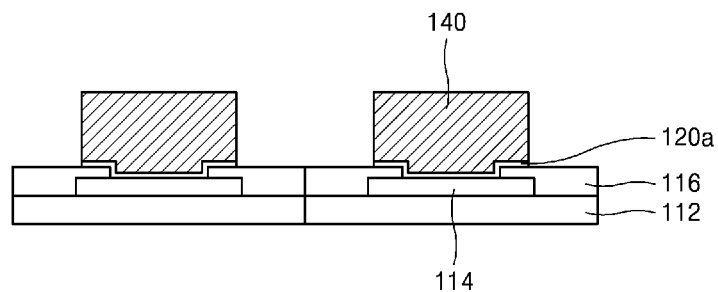

Referring to FIGS. 1E and 1F, after the bump pattern 140 is formed, the photoresist pattern 130 is removed. Then, parts of the UBM layer 120 exposed by the bump pattern 140 may be removed and heat treatment may be performed. Therefore, the final UBM layer 120 may remain only under a lower surface of the bump pattern 140.

Figure 1G:
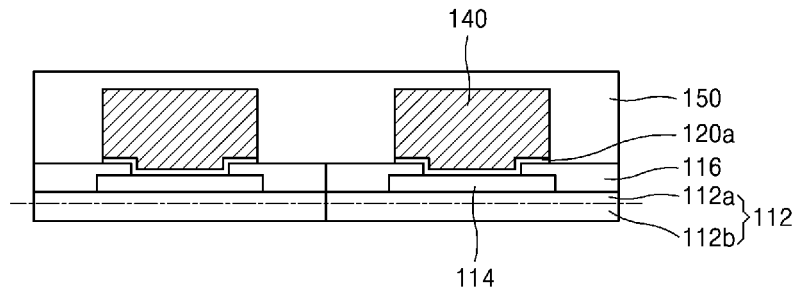

Referring to FIG. 1G, a backgrinding film 150 is attached to an upper surface of the wafer 112. After a circuit formation process, a backgrinding process is performed to uniformly thin a semiconductor wafer. In the backgrinding process, to protect circuits formed on the surface of the semiconductor wafer, a wafer-processing adhesive sheet called a backgrinding film is attached to the surface of the circuits. As such, the backgrinding film 150 is required to have an adhesive force sufficient to firmly protect the surface of the circuits and prevent permeation of cutting water during the backgrinding process, and is required to be easily detachable without causing a remnant of an adhesive after the backgrinding process. The backgrinding film 150 may include, for example, a polyester (PE), EMC, PVC, or PBO film.

For example, the backgrinding film 150 including a detachable adhesive layer using an energy-ray-curable adhesive or a water-swellable adhesive may be provided. The above-described backgrinding film 150 may be reduced in the adhesive force due to irradiation of an energy ray or water-swelling after the backgrinding process, and thus may be easily detached. However, since a special process such as irradiation of an energy ray or water-swelling is required to detach the backgrinding film 150, process complexity may increase and costs may also increase. For this reason, a weakly adhesive and detachable backgrinding film 150 capable of being detached without using a special process such as irradiation of an energy ray or water-swelling, and of reducing the number of processes may also be provided.

Then, after the backgrinding film 150 is attached, a rear surface of the wafer 112 is ground by a certain thickness. That is, a part 112b of the wafer 112 is ground and only a residue 112a thereof remains.

FIGS. 2A to 2E are cross-sectional views for sequentially describing second-half steps of a method of manufacturing a bump structure, according to a first embodiment of the present invention. In the method according to the first embodiment of the present invention, the steps described above in relation to FIGS. 1A to 1G are initially performed and then steps to be described below in relation to FIGS. 2A to 2E are performed.

Figure 2A:
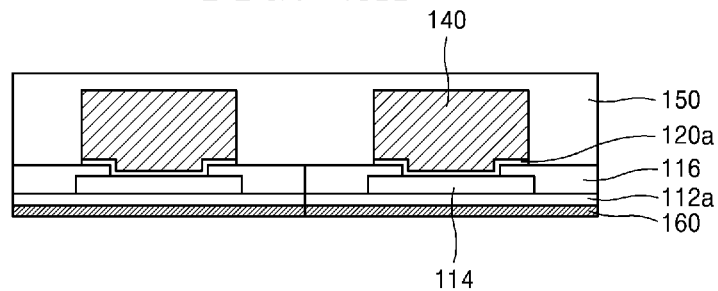
FIGS. 2A to 2E are cross-sectional views for sequentially describing second-half steps of a method of manufacturing a bump structure, according to a first embodiment of the present invention.

Referring to FIG. 2A, a flexible material layer 160 is formed on a second rear surface of the wafer 112a after being ground. The flexible material layer 160 may include, for example, an acrylic or hotmelt layer. The second rear surface refers to a rear surface of the wafer 112a after being ground, and differs from a first rear surface which refers to the rear surface of the wafer 112 before being ground. The flexible material layer 160 may contain a liquid component and may be attached to or coated on the second rear surface of the wafer 112a. The flexible material layer 160 may be hardened by a curing process. However, the curing process is performed not immediately after the flexible material layer 160 is formed but after dicing tape is attached.

Figure 2B:
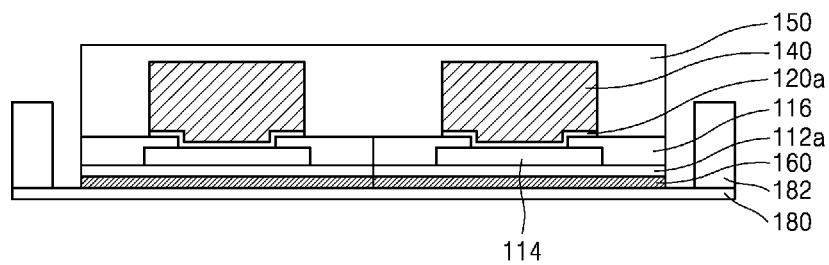

Referring to FIG. 2B, after the flexible material layer 160 is formed, dicing tape 180 including a ring frame 182 is attached to the flexible material layer 160 in a direction toward the rear surface of the wafer 112a. The dicing tape 180 may include, for example, PE or PVC. An area of the dicing tape 180 may be greater than an area of the flexible material layer 160. For example, the area of the flexible material layer 160 may be equal to an area of the wafer 112a, and the area of the dicing tape 180 may be greater than the area of the wafer 112a. The ring frame 182 may be provided in a ring shape on the edge of the dicing tape 180.

Figure 2C:
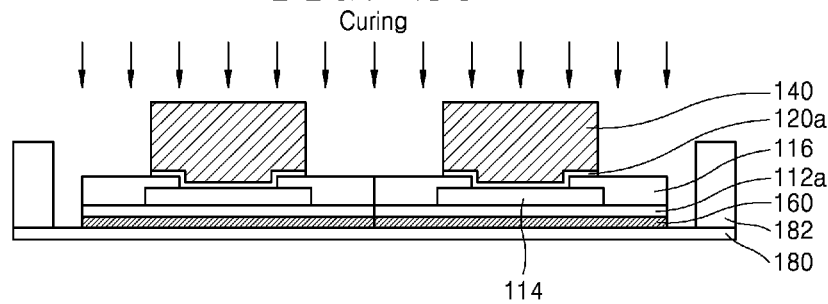

Referring to FIG. 2C, after the backgrinding film 150 is removed, a curing process is performed to harden the flexible material layer 160. Warpage of the thinned wafer 112a may occur during the curing process of the flexible material layer 160. In the current embodiment, since the thinned wafer 112a is attached to and supported by the dicing tape 180 before the curing process is performed, warpage of the wafer 112a may be prevented during the curing process of the flexible material layer 160.

In the method according to the first embodiment of the present invention, the dicing tape 180 is attached before the backgrinding film 150 is removed. Warpage of the wafer 112a may also occur during the process of removing the backgrinding film 150. As such, in the current embodiment, since the thinned wafer 112a is attached to and supported by the dicing tape 180 before the backgrinding film 150 is removed, warpage of the wafer 112a may be prevented during the process of removing the backgrinding film 150.

Figure 2D:
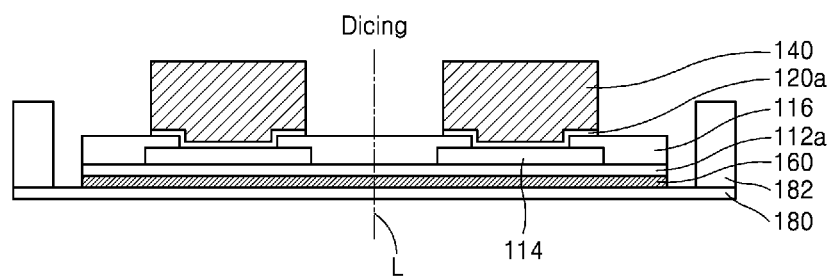
Figure 2E:
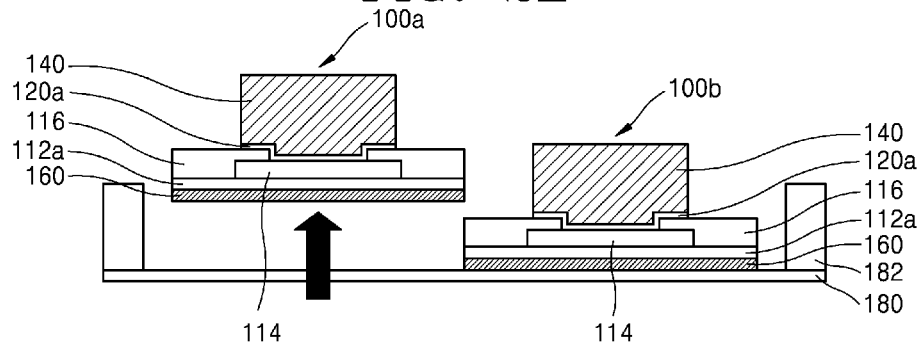

Sequentially referring to FIGS. 2D and 2E, a dicing process is performed to cut the plurality of chips into individual chips 100a and 100b. During the process of cutting the plurality of chips into the individual chips 100a and 100b, the dicing tape 180 may not be cut but the hardened flexible material layer 160 may be cut.

According to a modified first embodiment of the present invention, the steps described above in relation to FIGS. 1A to 1G are initially performed and then the steps described above in relation to FIGS. 2B to 2D are performed. In this case, the step described above in relation to FIG. 2B may be understood as an step of attaching an integrated film of the flexible material layer 160 and the dicing tape 180 to the second rear surface of the wafer 112a after being ground. That is, instead of initially forming, as illustrated in FIG. 2A, the flexible material layer 160 on the second rear surface of the wafer 112a after being ground, the integrated film of the flexible material layer 160 and the dicing tape 180 may be attached to the second rear surface of the wafer 112a at a time. Subsequent steps are as described above in relation to FIGS. 2C to 2E.

FIGS. 3A to 3E are cross-sectional views for sequentially describing second-half steps of a method of manufacturing a bump structure, according to a second embodiment of the present invention. In the method according to the second embodiment of the present invention, the steps described above in relation to FIGS. 1A to 1G are initially performed and then steps to be described below in relation to FIGS. 3A to 3E are performed.

Figure 3A:
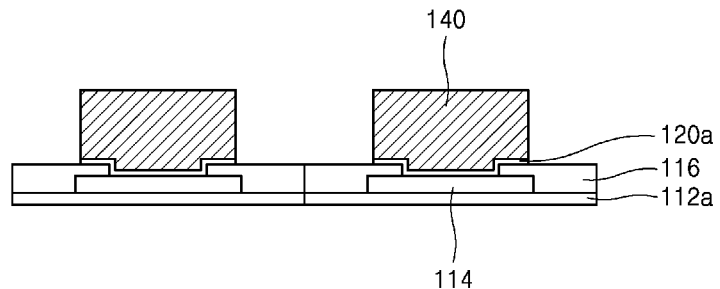
FIGS. 3A to 3E are cross-sectional views for sequentially describing second-half steps of a method of manufacturing a bump structure, according to a second embodiment of the present invention.

Referring to FIG. 3A, after the backgrinding process is performed on the rear surface of the wafer 112, the backgrinding film 150 on the upper surface of the wafer 112a is removed.

Figure 3B:
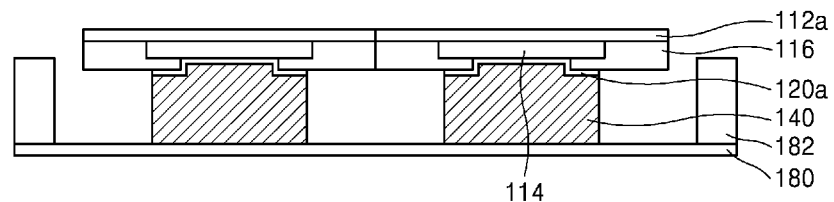

Referring to FIG. 3B, after the backgrinding film 150 is removed, the exposed bump pattern 140 is attached to the dicing tape 180 including the ring frame 182. After the bump pattern 140 is attached to the dicing tape 180, the whole structure may be turned upside down.

Figure 3C:
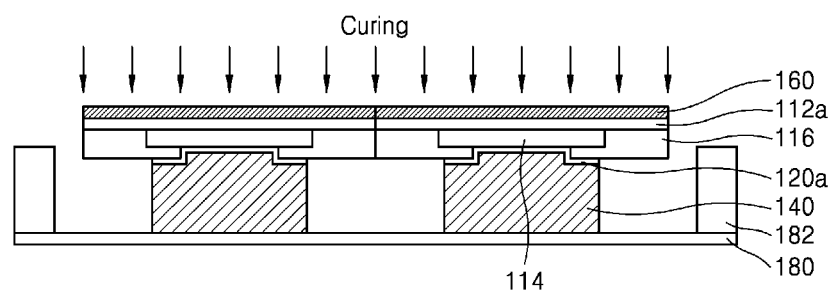

Referring to FIG. 3C, the flexible material layer 160 is formed on the second rear surface of the wafer 112a after being ground, and a curing process is performed to harden the flexible material layer 160. In the method according to the second embodiment of the present invention, the curing process for hardening the flexible material layer 160 may also be performed after the dicing tape 180 is attached. Warpage of the thinned wafer 112a may occur during the curing process of the flexible material layer 160. In the second embodiment of the present invention, since the bump pattern 140 formed on the thinned wafer 112a is attached to and supported by the dicing tape 180 before the curing process is performed, warpage of the wafer 112a may be prevented during the curing process of the flexible material layer 160.

Figure 3D:
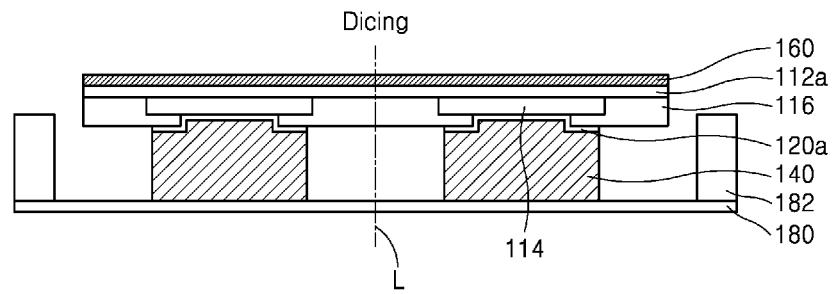
Figure 3E:
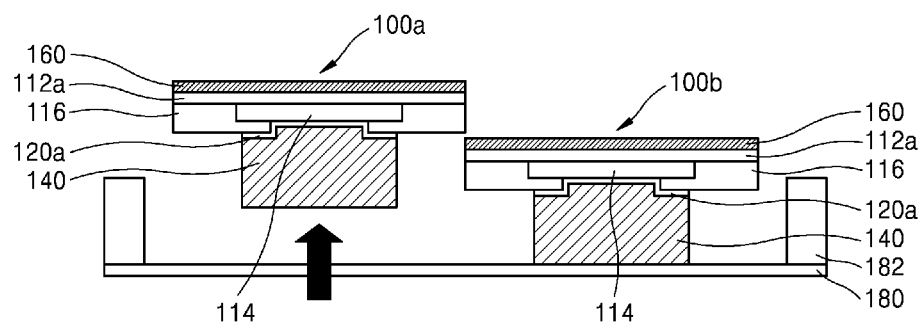

Sequentially referring to FIGS. 3D and 3E, a dicing process is performed to cut the plurality of chips into the individual chips 100a and 100b. During the process of cutting the plurality of chips into the individual chips 100a and 100b, the dicing tape 180 may not be cut but the hardened flexible material layer 160 may be cut.

FIGS. 4A to 4D are cross-sectional views for sequentially describing second-half steps of a method of manufacturing a bump structure, according to a comparative example of the present invention. In the method according to the comparative example of the present invention, the steps described above in relation to FIGS. 1A to 1G are initially performed and then steps to be described below in relation to FIGS. 4A to 4D are performed.

Figure 4A:
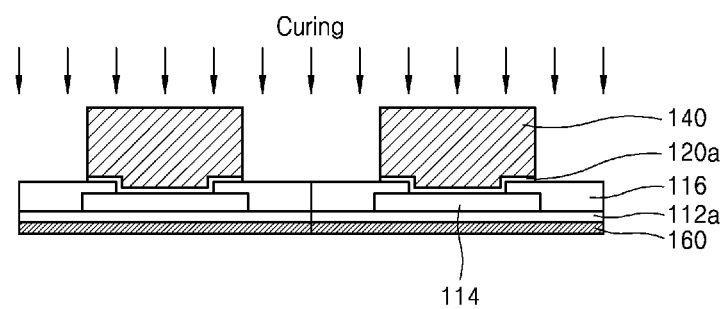
FIGS. 4A to 4D are cross-sectional views for sequentially describing second-half steps of a method of manufacturing a bump structure, according to a comparative example of the present invention.
Figure 4B:
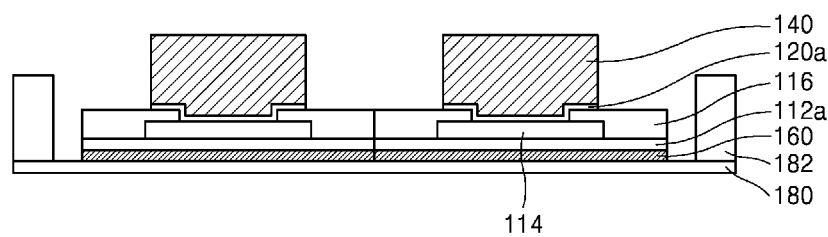
Figure 4C:
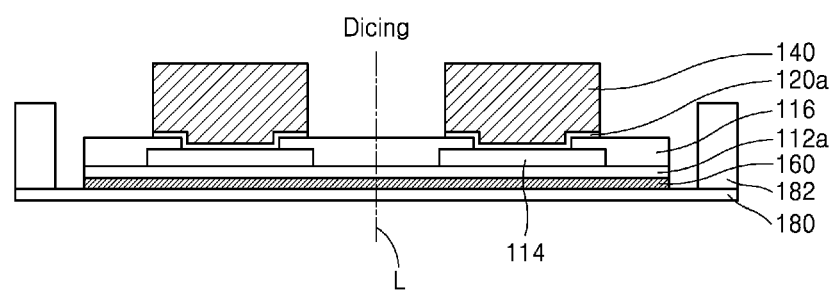
Figure 4D:
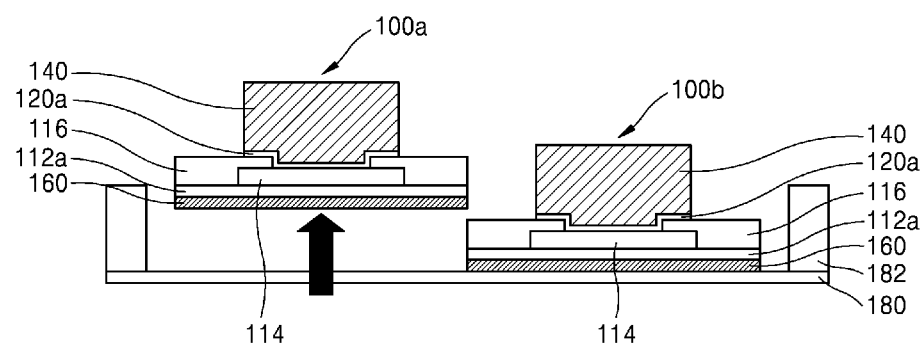

Referring to FIG. 4A, after the backgrinding process is performed on the rear surface of the wafer 112, the backgrinding film 150 on the upper surface of the wafer 112a is removed. Warpage of the wafer 112a may occur during the process of removing the backgrinding film 150. However, in the comparative example, since the backgrinding film 150 is removed while the thinned wafer 112a is not supported, warpage of the wafer 112a may not be avoided.

After the backgrinding film 150 is removed, the flexible material layer 160 is formed on the second rear surface of the wafer 112a after being ground, and a curing process is performed to harden the flexible material layer 160. In the comparative example of the present invention, the curing process is performed immediately after the flexible material layer 160 is formed and before dicing tape is attached. That is, since warpage of the thinned wafer 112a may also occur during the curing process of the flexible material layer 160 and the flexible material layer 160 is cured while the thinned wafer 112a is not supported, warpage of the wafer 112a may not be prevented.

Unlike the comparative example, according to the aforedescribed embodiments of the present invention, warpage due to wafer thinning may be easily prevented and such an effect has been verified in the field.

While the present invention has been particularly shown and described with reference to embodiments thereof, it will be understood by one of ordinary skill in the art that various changes in form and details may be made therein without departing from the scope of the present invention as defined by the following claims.

The invention claimed is:

1. A method of manufacturing a bump structure, the method comprising:
   a first step for preparing a wafer comprising a plurality of chips each comprising a die pad, an under bump metal (UBM) layer on the die pad, and a bump pattern on the UBM layer;
   a second step for attaching a backgrinding film to an upper surface of the wafer;
   a third step for grinding a rear surface of the wafer by a certain thickness;
   a fourth step for removing the backgrinding film;
   a fifth step for attaching the bump pattern to dicing tape comprising a ring frame;
   a sixth step for forming a flexible material layer on a second rear surface of the wafer after being ground;

a seventh step for performing a curing process to harden the flexible material layer;

an eighth step for performing a dicing process to cut the plurality of chips into individual chips.

2. The method of claim 1, wherein the curing process to harden the flexible material layer is performed after the dicing tape is attached.

3. The method of claim 1, wherein the flexible material layer comprises a film containing a liquid component.

* * * * *